(12) United States Patent
Fink (10) Patent No.: US 9,964,764 B2
(45) Date of Patent: May 8, 2018

(54) VISUAL TRAINING DEVICES, SYSTEMS, AND METHODS

(71) Applicant: Ryan Fink, Vancouver, WA (US)

(72) Inventor: Ryan Fink, Vancouver, WA (US)

(73) Assignee: Atheer Labs, Inc., Mountain View, CA (US)

( * ) Notice: Subject to any disclaimer, the term of this patent is extended or adjusted under 35 U.S.C. 154(b) by 157 days.

(21) Appl. No.: 14/300,017

(22) Filed: Jun. 9, 2014

(65) Prior Publication Data

US 2014/0292812 A1 Oct. 2, 2014

Related U.S. Application Data

(63) Continuation of application No. 12/869,481, filed on Aug. 26, 2010, now Pat. No. 8,788,197.

(60) Provisional application No. 61/329,648, filed on Apr. 30, 2010.

(51) Int. Cl.
| | | |
|---|---|---|
| *G01B 11/14* | (2006.01) | |
| *G02B 27/01* | (2006.01) | |
| *G01J 1/04* | (2006.01) | |
| *G01J 1/42* | (2006.01) | |
| *G03F 7/20* | (2006.01) | |
| *G09G 5/377* | (2006.01) | |

(52) U.S. Cl.
CPC .............. *G02B 27/017* (2013.01); *G01J 1/04* (2013.01); *G01J 1/0414* (2013.01); *G01J 1/4228* (2013.01); *G03F 7/7085* (2013.01); *G03F 7/70116* (2013.01); *G03F 7/70891* (2013.01); *G09G 5/377* (2013.01); *G02B 2027/0178* (2013.01)

(58) Field of Classification Search
CPC ........ G08G 5/0095; G09G 5/00; G09G 5/377; G02B 27/017; G02B 2027/0178; G01J 1/04; G01J 1/0414; G01J 1/4228; G03F 7/70116; G03F 7/7085; G03F 7/70891
USPC .................. 356/614, 121, 401, 421; 701/532, 701/432–436
See application file for complete search history.

(56) References Cited

U.S. PATENT DOCUMENTS

| | | | |
|---|---|---|---|
| 6,989,831 B2 * | 1/2006 | Ebersole ............ | A62C 99/0081 345/420 |
| 7,751,122 B2 * | 7/2010 | Amitai ..................... | G02B 6/10 359/630 |
| 8,788,197 B2 * | 7/2014 | Fink ................... | A63B 71/0622 701/436 |
| 8,965,460 B1 * | 2/2015 | Rao et al. ..................... | 455/566 |
| 2008/0036653 A1 * | 2/2008 | Huston .................... | 342/357.07 |

* cited by examiner

*Primary Examiner* — Hina F Ayub
(74) *Attorney, Agent, or Firm* — Mohr Intellectual Property Law Solutions, P.C.

(57) ABSTRACT

Visual training aids including an eyewear article including a lens, an image generator mounted to the eyewear article in a position to display an image on the lens, a processor operatively connected to and in data communication with the image generator, a global positioning system operatively connected to and in data communication with the processor, a computer readable medium operatively connected to and in data communication with the processor. In some examples, the visual training aid includes a pair of eyeglasses. In some examples, the visual training aid includes a display monitor mounted to the eyewear. In some examples, the visual training aid includes a camera mounted to the eyewear.

20 Claims, 2 Drawing Sheets

FIG. 1

VISUAL TRAINING DEVICES, SYSTEMS, AND METHODS

CROSS REFERENCE TO RELATED APPLICATIONS

This application claims priority to copending U.S. application Ser. No. 12/869,481, filed on Aug. 26, 2010, which is an application claiming the benefit of U.S. Provisional Application Ser. No. 61/329,648, filed on Apr. 30, 2010, under section 35 USC 119(c). Both of U.S. application Ser. No. 12/869,481 and U.S. Provisional Application Ser. No. 61/329,648 are hereby incorporated by reference for all purposes.

BACKGROUND

The present disclosure relates generally to visual training devices, systems, and methods, collectively visual training aids. In particular, location aware visual training aids are described herein.

Training assistance devices in the art are not entirely satisfactory. Specifically, training aids in the art provide users with limited training data during a workout. Training data typically provided by conventional training devices includes current and average speed information, pace information, route information, the time in which the user completes a particular route, current and average heart rate information, and current or average cadence information.

Training assistance devices in the art that provide visual data often require users to look away from their path to a separate device, such as a watch or mobile device. Both looking away from the path and handling other devices can have detrimental effect on an athlete's pace and route. Additionally, these distractions may cause safety concerns due to the lack of focus on the route.

The advancement of video eyewear technologies now allows users to view computer generated graphics on a display proximate their eyes and substantially cover their entire field of vision. Such technologies generally achieve this functionality by attaching projectors to a set of eyewear that are capable of projecting graphical images on the lenses. These displays may receive a computer generated image from an external source and use a series of mirrors to project this image on the lens, thereby placing computer generated graphical images in the user's natural line of vision. There are, however, other technologies by which images are displayed on the lenses of such video eyewear, including more traditional display technologies such as LCD.

These video eyewear technologies are particularly suited to the display of "augmented reality" displays. "Augmented reality" displays comprise a computer generated graphical display laid over a portion of a user's or mobile device's natural field of vision. These "augmented reality" displays allow a user to view computer generated images including data related to objects in their natural field of vision. Augmented reality displays may include any display including both natural and computer generated elements.

Additionally, the advancement of mobile computing devices have allowed for the development of substantially featured computing devices that afford great portability. These devices often include software development kits and application programming interfaces that allow for the development of software and drivers to allow the driver to interact with a wide array of external hardware. Additionally, these devices often allow connection to the internet and local networks through various protocols. These devices may also include functionality that acquire data relating to location and movement, including, but not limited to, global positioning system receivers, accelerometers, magnetometers, and pedometers.

Examples of mobile computing devices include Apple iPhone mobile devices, mobile devices designed with the Android operating system, other mobile phone devices, portable media players, personal computers, watches, and other mobile computing devices that are capable of executing third party developed software.

SUMMARY

The present disclosure is directed to visual training aids including an eyewear article including a lens, an image generator mounted to the eyewear article in a position to display an image on the lens, a processor operatively connected to and in data communication with the image generator, a global positioning system operatively connected to and in data communication with the processor, a computer readable medium operatively connected to and in data communication with the processor. In some examples, the visual training aid includes a pair of eyeglasses. In some examples, the visual training aid includes a display monitor mounted to the eyewear. In some examples, the visual training aid includes a camera mounted to the eyewear.

DETAILED DESCRIPTION

The disclosed visual training aids will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various visual training aids are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

Various examples of visual training aids may be implemented using electronic circuitry configured to perform one or more functions. For example, with some embodiments of the invention, the visual training aid may be implemented using one or more application-specific integrated circuits (ASICs). More typically, however, components of various examples of the invention will be implemented using a programmable computing device executing firmware or software instructions, or by some combination of purpose-specific electronic circuitry and firmware or software instructions executing on a programmable computing device.

Figure 1:
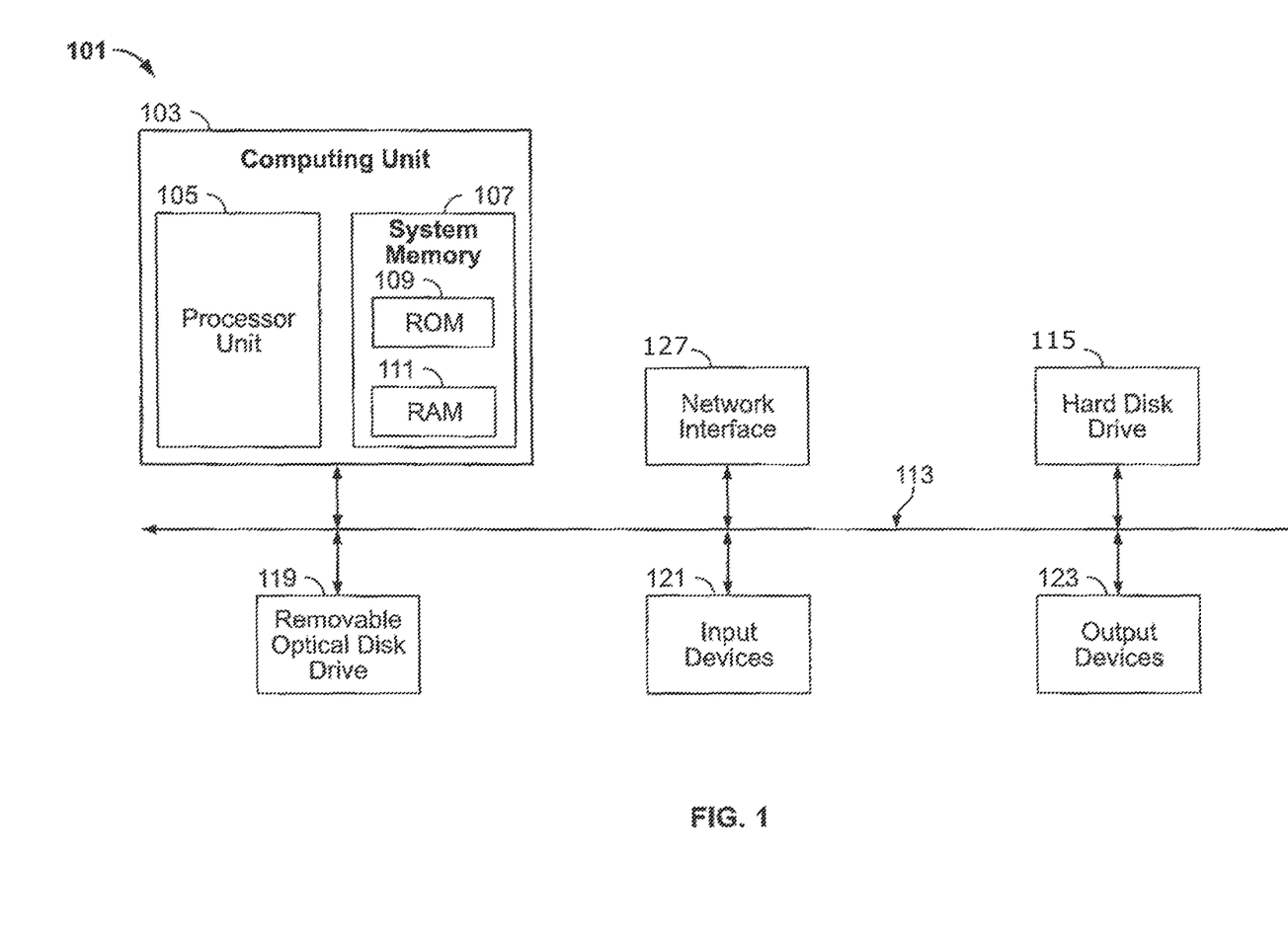
FIG. 1 is a schematic view of a computing device that may be used to implement various aspects of visual training aids.

Accordingly, FIG. 1 shows one illustrative example of a computer 101 that can be used to implement various embodiments of the invention. Computer 101 may be incorporated within a variety of consumer electronic devices, such as personal media players, cellular phones, smart phones, personal data assistants, global positioning system devices, and the like.

As seen in this figure, computer 101 has a computing unit 103. Computing unit 103 typically includes a processing unit 105 and a system memory 107. Processing unit 105 may be any type of processing device for executing software instructions, but will conventionally be a microprocessor device. System memory 107 may include both a read-only memory (ROM) 109 and a random access memory (RAM) 111. As will be appreciated by those of ordinary skill in the art, both read-only memory (ROM) 109 and random access memory (RAM) 111 may store software instructions to be executed by processing unit 105.

Processing unit 105 and system memory 107 are connected, either directly or indirectly, through a bus 113 or alternate communication structure to one or more peripheral devices. For example, processing unit 105 or system memory 107 may be directly or indirectly connected to additional memory storage, such as a hard disk drive 115, a removable magnetic disk drive 117, an optical disk drive 119, and a flash memory card 121. Processing unit 105 and system memory 107 also may be directly or indirectly connected to one or more input devices 123 and one or more output devices 125. Input devices 123 may include, for example, a keyboard, touch screen, a remote control pad, a pointing device (such as a mouse, touchpad, stylus, trackball, or joystick), a scanner, a camera or a microphone. Output devices 125 may include, for example, a monitor display, an integrated display, television, printer, stereo, or speakers.

Still further, computing unit 103 will be directly or indirectly connected to one or more network interfaces 127 for communicating with a network. This type of network interface 127, also sometimes referred to as a network adapter or network interface card (NIC), translates data and control signals from computing unit 103 into network messages according to one or more communication protocols, such as the Transmission Control Protocol (TCP), the Internet Protocol (IP), and the User Datagram Protocol (UDP). These protocols are well known in the art, and thus will not be discussed here in more detail. An interface 127 may employ any suitable connection agent for connecting to a network, including, for example, a wireless transceiver, a power line adapter, a modem, or an Ethernet connection.

It should be appreciated that, in addition to the input, output and storage peripheral devices specifically listed above, the computing device may be connected to a variety of other peripheral devices, including some that may perform input, output and storage functions, or some combination thereof. For example, the computer 101 may be connected to a digital music player, such as an IPOD® brand digital music player or IPHONE® brand smartphone available from Apple, Inc. of Cupertino, Calif. As known in the art, this type of digital music player can serve as both an output device for a computer (e.g., outputting music from a sound file or pictures from an image file) and a storage device. In addition, this type of digital music play also can serve as an output device for outputting visual training information, as will be discussed in more detail below.

In addition to a digital music player, computer 101 may be connected to or otherwise include one or more other peripheral devices, such as a telephone. The telephone may be, for example, a wireless "smart phone." As known in the art, this type of telephone communicates through a wireless network using radio frequency transmissions. In addition to simple communication functionality, a "smart phone" may also provide a user with one or more data management functions, such as sending, receiving and viewing electronic messages (e.g., electronic mail messages, SMS text messages, etc.), recording or playing back sound files, recording or playing back image files (e.g., still picture or moving video image files), viewing and editing files with text (e.g., Microsoft Word or Excel files, or Adobe Acrobat files), etc. Because of the data management capability of this type of telephone, a user may connect the telephone with computer 101 so that their data maintained may be synchronized.

Of course, still other peripheral devices may be included with our otherwise connected to a computer 101 of the type illustrated in FIG. 1, as is well known in the art. In some cases, a peripheral device may be permanently or semi-permanently connected to computing unit 103. For example, with many computers, computing unit 103, hard disk drive 117, removable optical disk drive 119 and a display are semi-permanently encased in a single housing.

Still other peripheral devices may be removably connected to computer 101, however. Computer 101 may include, for example, one or more communication ports through which a peripheral device can be connected to computing unit 103 (either directly or indirectly through bus 113). These communication ports may thus include a parallel bus port or a serial bus port, such as a serial bus port using the Universal Serial Bus (USB) standard or the IEEE 1394 High Speed Serial Bus standard (e.g., a Firewire port). Alternately or additionally, computer 101 may include a wireless data "port," such as a Bluetooth interface, a Wi-Fi interface, an infrared data port, or the like.

It should be appreciated that a computing device employed according various examples of the invention may include more components than computer 101 illustrated in FIG. 1, fewer components than computer 101, or a different combination of components than computer 101. Some implementations of the invention, for example, may employ one or more computing devices that are intended to have a very specific functionality, such as a digital music player or server computer. These computing devices may thus omit unnecessary peripherals, such as the network interface 115, removable optical disk drive 119, printers, scanners, external hard drives, etc. Some implementations of the invention may alternately or additionally employ computing devices that are intended to be capable of a wide variety of functions, such as a desktop or laptop personal computer. These computing devices may have any combination of peripheral devices or additional components as desired.

Figure 2:
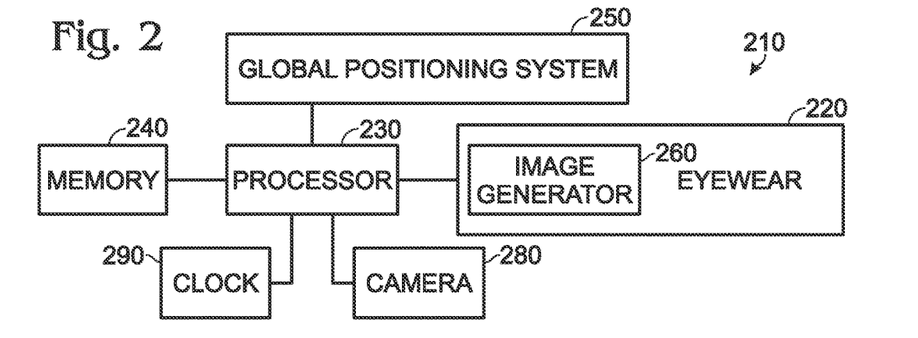
FIG. 2 is a schematic view of a first example of a visual training aid.

With reference to FIG. 2, a visual training aid 210 includes eyeglasses 220, a processor 230, memory 240, a global positioning system 250, and an image generator 260. Visual training aid 210 further includes an optional image capturing device or camera or 280 to capture images of the terrain surrounding the user. Additional components are included in certain examples, such as laser range finders and radar systems. Appropriate clocks and other time keeping devices, whether physical or software based, are contemplated for measuring relevant time intervals. Additionally or alternatively, the visual training aid may include data cables, wireless data transmitters and receivers, and removable computer readable storage mediums.

As will be described in more detail below, visual training aids, such as visual training aid 210, provide users with dynamically updated visual training data during a workout or athletic activity. Visual training aids described herein may be used in a variety of activities, including running, skiing, snowboarding, bicycling, horseback riding, racecar driving, motorcycle driving, and other timed competitive endeavors. The visual data helps to provide the user with an awareness of his position relative to the position of a competitor or to his own prior performance on a course. This visual data may thus stimulate the user's competitive drive and enhance his workout performance and training satisfaction.

Indeed, the visual training aids enhance training effectiveness and motivation through simulating elements of competition during solo training endeavors. With brief reference to a visual training aid 310 shown in FIG. 3 for demonstrating an example of simulated competition provided by the visual training aids described herein, the reader can see that a user utilizing visual training aid 310 sees an augmented reality display 370 including a computer generated representation of a first person 372 and a computer generated image of a second person 374. A person in this context may also be referred to as a "competitor," a "virtual competitor," or a "prior performer."

Figure 3:
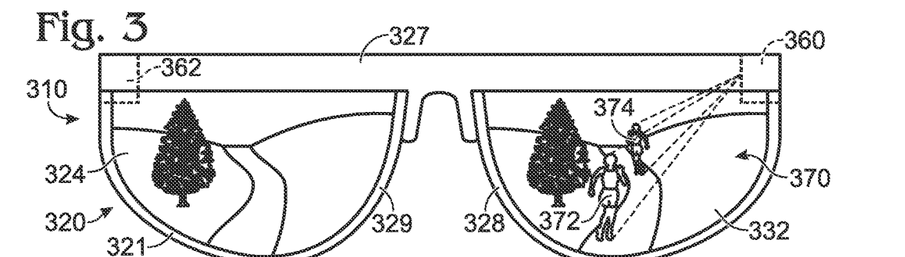
FIG. 3 is a rear elevation view of a visual training aid including a pair of eyeglasses.

The computer generated images of the first and second persons may be either static or animated and may depict another person's performance on the course or the user's own past performance on the course. The computer generated images depicting the apparent position of the virtual competitors 372 and 374 relative to the wearer and the surroundings are continually updated based on the position of competitors 372 and 374 on the course during a prior training session relative the user's current position at the same given time interval.

For example, if the user's performance falls behind the competitor's prior pace on the course, representations of the competitor are displayed such that they appear in front of the user from the user's current vantage point. If the user's performance is faster than the competitor's prior pace, representations of the competitor are displayed such that they appear behind the user from the user's vantage point. If a user's pace is substantially the same as the competitor's prior pace on the course, representations of the competitor are projected to appear to the side of the user. The relative position of the trainer and representation of the prior performer will be constantly changing as their respective velocities change throughout the course.

By viewing these displays of a virtual competitor, the user will see how his performance is comparing to a prior performance or a desired hypothetical performance. Viewing displays of dynamically updated virtual competitors also allow the user to simulate competition, making for a more enjoyable and effective training experience.

With reference to FIG. 2, the components of visual training aid 210 will now be described. Eyewear 220 serves to support selected components of visual training aid 210 and to position an augmented reality display in a position to be viewed by a user of the visual training aid. Eyewear may include monocles, goggles, head mounted displays, helmet mounted displays, or any other arrangement of lenses supported proximate the eye.

The reader should understand that the visual training aids described herein do not require eyewear. Indeed, in some examples the computer generated display of virtual competitors is displayed on a mobile computing device, such as the display or screen of a mobile phone, including an iPhone® brand mobile phone, a personal media player, including the iTouch® personal media player, a personal data assistant, and the like.

In examples without eyewear, the user carries the mobile device with him during a training session and looks at the screen, for example, by holding the mobile device in front of him, to see on the screen or display the position of virtual competitors relative to his own position. In one example, the augmented reality display on the mobile device includes a map depicting the course, similar to a global positioning system map depicting a route, with virtual competitors positioned relative to the user's current position on the map. In other examples, the augmented reality display is a real-time image of the surroundings visible through a camera lens of the mobile device with computer generated virtual competitors represented on the display in a position reflecting the difference in position between the user's current position and the person's position on the course during a prior training session at the same given time interval.

Processor 230 is programmed with instructions for receiving data from components of visual training aid 210, including memory 240, global positioning system 250, camera 280, and clock or timer 290. Data from components of visual training aid 210, such as global positioning system 250, camera 280, and clock 290 may be in a raw format that is not directly usable by other components of visual training aid 210, such as image generator 260 or memory 240. Accordingly, processor 230 is programmed with instructions for translating, computing, converting, correlating, and integrating (collectively "processing") data from each component into usable formats.

For example, processor 230 is programmed with instruction for processing prior position data and prior time interval data from memory 240, current position data from global positioning system 250, terrain image data from camera 280, and current time interval data from clock 290. The processed data may be stored into memory 240, communicated to databases or devices over the internet, or sent to other components of visual training aid 210, such as image generator 260. Although processor 230 may process and store processed data, visual training aid 210 storing raw data into memory 240 or into other databases is equally within this disclosure. Data collected by components of visual training aid 210 may be displayed in a readable way, stored and retrieved to local or remote storage means, including mobile devices, cloud technologies, internet servers, and social networking applications and sites.

Reading past position data from memory 240 may include reading multiple sets of past position data from memory 240. For example, each set of past position data may correspond to a person's position on the course during prior training sessions at a given time interval relative to the respective course start times for each prior training session. The past position data may correspond to different people's position or a single person's position during two or more prior training sessions.

Processor 230 is programmed with instruction for determining a current position of the user or eyewear article on a course at a given time interval relative to a current course start time. To make these determinations, processor 230 dynamically current position data from global positioning system 260 and time interval data from clock 290. Additionally or alternatively, the processor may receive one or more of these data from memory.

Processor 230 is further programmed with instructions for generating competitor image data depicting a person's position on a course relative to the user's current position at a given time interval. The competitor image data may include data corresponding to images of multiple competitors. The competitor image data includes instructions for image generator 260 to display an image on the lens depicting a person's or competitor's position on the course during a prior training session relative to the current position of the user or of eyewear article 220 at a given time interval.

The competitor image data may include various parameters determining how the image of the virtual competitor will be displayed. For example, the competitor image data may include where in the user's field of view the computer generated image of the virtual competitor is to be displayed to account for where the user is currently looking. Additionally or alternatively, the competitor image data may include the size of the image of the virtual competitor to display to account for proper distance and perspective. Further, the competitor image data may include the profile of the virtual competitor to display, e.g., a view of the virtual competitor's back, left side, right side, or front, to account for where the user is looking and the respective position of the user and the person's prior position on the course at the relevant time interval.

For example, processor 230 may be programmed with instructions to dynamically adjust the direction in which the graphical representation of a prior performer's position is displayed based on dynamically updated data representing the direction the user is currently looking. For example, if the user is looking straight ahead and the competitor's prior performance at that given time interval was ahead of the user's current position, the processor instructions specify that the graphical representation of the prior performer be displayed to appear in front of the user. If the user were to look to his right 60°, the processor instructions specify that the graphical representation of the prior performer be displayed to appear 600 to the left of the user.

The visual training aids described herein may include any conventional means for detecting the direction a user is looking. For example, the visual training aid may include eye tracking devices, accelerometers to detect head position and orientation, image capturing devices to capture images of the terrain around the wearer, laser range finders, radar, and computer vision technologies.

Processor 230 is programmed with instructions for outputting or sending data to components of visual training aid 210, including memory 240 and image generator 260. For example, processor 230 is programmed with instructions for sending current position data and current time interval data to memory 250. Additionally, processor 230 is programmed with instructions for sending competitor image data to image generator 260, including competitor image data for multiple virtual competitors.

Processor 230 may be programmed with instructions to generate competitor image data including an animated depiction of a person on the course during a prior training session relative to the current position of the user or eyewear article at the given time interval. An animated depiction of the person or virtual competitor has been observed to increase the realism of the virtual competitor and to enhance the competitive effect of "racing" against the virtual competitor.

Processor 230 may be any conventional processor suitable for inputting, processing, and outputting data consistent with the functions and programmed instructions described herein. The processor may include multiple processors programmed to carry out specific instructions in concert. The processor may be specially fabricated for use in the visual training aids described herein or may employ commercially available processors or processors used for other devices.

For example, the processor used by visual training aids may be a processor incorporated within an Apple iPhone® brand mobile phone, which is designed for functions beyond those applicable to a visual training aid. User installed software may provide all necessary instructions and drivers to achieve the functions described herein of a visual training aid. Other suitable processors include those utilized by Apple iTouch® brand mobile devices, mobile devices designed with the Android® operating system, other mobile devices, including portable media players, personal computers, watches, and other mobile computing devices that are capable of executing third-party developed software.

Additionally or alternatively, proprietary processor systems designed specifically for use with visual training aids describe herein are equally within this disclosure. In such designs, the processor system may include operating system software.

Memory 240 may comprise any conventional data storage medium known in the art. For example, memory 240 may include magnetic media, optical media, flash media, and the like. Memory 240 may also include a plurality of memory units, each memory unit being the same media or one or more being different types of media.

In the example shown in FIG. 2, global positioning system 250 dynamically determines the current, real-time position of the user as he moves about a course. This data may be described as current position data. Additionally or alternatively, current position data may be obtained from external sensors that monitor the position of the user and/or a component of the visual training aid. Other technologies, including pedometers, accelerometers, and magnetometers, may work in conjunction with global positioning systems, and in some examples replace them, to generate position and other training data.

Any conventional global positioning system may be used for generating current position data. For example, commercially available, stand-alone global positioning systems as well as global positioning systems incorporated into other devices, such as cellular phones and portable media players, are suitable. Appropriate software, cables, or wireless data protocols may be employed to communicate the current position data from the global positioning system to the processor. In some examples, the processor used by a global positioning system itself may be programmed to carry out the functions and instructions of the visual training aids described herein.

The current position data is sent to processor 230 for generating instructions for use by image generator 260. Specifically, processor 230 uses the current position data and time stamped past position data of a prior person (or persons) stored in memory 240 to determine the position of the user relative to the person's position on the course during a prior training session at a given time interval. Time stamped position data refers to position data cross referenced with time interval data detailing how long into a training session person was at a given position. Processor 230 then sends image data to image generator 260 for displaying an image to the user depicting the person's position on the course during the prior training session relative to the current position of the user at the given time interval.

Processor 230 may be configured to use the current position data in conjunction with timing data from clock 290 to generate a wide range of training data. The training data may include the user's current speed, average speed, cadence information, and workout duration among various other useful metrics relating to the current workout, including previous pace in which the same route was completed. The training data may also include cues for the user, including graphical cues assisting the user to follow a route, such as maps and arrows, and cues assisting the user in knowing when to begin a particular workout. The training data may be displayed to the user over the course of a workout and/or may be stored in memory 240 for later retrieval.

In addition to the training data described above, processor 230 is configured to use the current position data in conjunction with timing data from clock 290 to generate and store a set of time-stamped position data for use in subsequent training sessions. The time stamped position data generated during a current training session can serve as past position data during subsequent training sessions, either by a $3^{rd}$ party trainee or by the user himself. That is, the user's time stamped position data processed by processor 230 and stored in memory 240 may be used by processor 230 during a subsequent training session as the basis for generating a virtual competitor for the user of visual training aid.

Image generator 260 displays an image on the lens for viewing by the user of visual training aid 210 based on competitor image data supplied by processor 230. In some examples, the image generator is configured to display a series of images in succession to define a video or an animated depiction of the virtual competitor.

Image generator 260 may include a wide variety of image display technologies. In some examples, the image generator includes a projector configured to project an image or a series of images onto the lens. In other examples, the image generator includes a hologram generating system for generating holograms viewable by the user. In some examples, the image generator includes a heads-up-display projection system.

In still further other examples, the image generator is configured to display in image visible to the user on a screen or display that at least partially blocks a user's view through the lens. For example, the visual training aid may include an opaque screen positioned across at least a portion of at least one of the lenses in a pair of eyeglasses and a projector configured to project an image onto the screen. In another example, the image generator includes a display monitor, such as a liquid crystal display, positioned across at least a portion of a lens for displaying an image or a series of images to a user. While the user is unable to see through the screen or the display monitor, the image generator may display images corresponding to the user's surroundings based on terrain image data supplied by 230 processor in conjunction with camera 280.

Camera 280 serves to capture images of a course, including the user's surroundings and the corresponding terrain. Data corresponding to images of the course and surroundings may be described as terrain image data or course image data. When displayed on the lens of eyewear 220, the terrain image data enables the user to perceive his surroundings even if he does not have a direct line of sight to his surroundings. For example, the terrain image data may enable the user to perceive his surroundings when an opaque screen or display monitor is positioned in front of one of more of his eyes.

In some examples, camera 280 is a video camera configured to capture a series of images in succession to define a video. A wide variety of acceptable cameras and/or video cameras are commercially available. The resolution of the cameras may be selected to optimize data throughput and image quality. Acceptable resolutions include interlaced and progressive image scans at 480, 525, 720, 1080 vertical scanning lines, as well as vertical scanning lines in between, higher, and lower than these example values.

In some examples, the visual training aid includes two or more cameras. In one example, a first camera is positioned to capture forward course image data corresponding to images of the course forward of a user wearing the eyewear and a second camera is positioned to capture rearward course image data corresponding to images of the course behind the user. In other examples, a sufficient number of cameras are used to capture images providing a substantially 360° view of the course.

The reader should understand that the camera is an optional feature of the visual training aids described herein. In some examples, the visual training aid does not include a camera. For instance, when the image generator is configured to display images of virtual competitors on a substantially transparent lens, the user can see the course and the terrain through the lens without the need for a camera. In these examples, the depictions of the virtual competitors are integrated with the actual view of the course and the terrain through the lens by where and how they are displayed on the lens.

Clock 290 may be any conventional mechanical or software based time keeping device. In addition to a host of conventional functions a clock may serve in conjunction with a processor in a computing device, clock 290 serves as a timer for generating time interval data.

The time interval data corresponds to the time difference between a given time on a course after starting a training session on the course. A current time interval is applicable to a user's current training session and is defined as the user's current time on a course minus the user's current course start time. A past time interval is applicable to a person's prior training session on a course and is defined as the time difference between a given time on the course and the person's past course start time.

The current time interval will dynamically increase with the passage of time after a current course start time. Clock 290 is configured to dynamically output time interval data to processor 230. Processor 230 uses the current time interval data to determine which past position data is applicable for generating image data to image generator 260. In particular, processor 230 will select past position data having a past time interval equal to the current time interval to correlate a person's position on the course during a prior training session with a user's current position on a course at a same given time interval. In this manner, the relative position of the virtual competitor at a given time interval corresponding to how long the user has currently been on the course can be displayed to the user.

Figure 4:
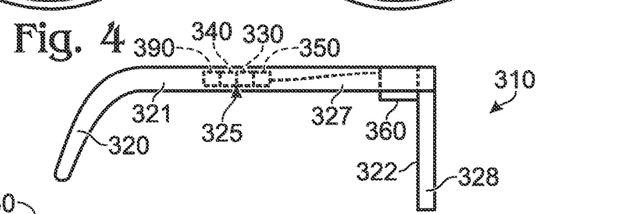
FIG. 4 is a side elevation view of the visual training aid shown in FIG. 3.

Turning attention to FIGS. 3 and 4, a visual training aid 310 will now be described. Visual training aid 310 includes many similar or identical features to visual training aid 210 combined in unique and distinct ways. Thus, for the sake of brevity, each feature of visual training aid 310 will not be redundantly explained. Rather, key distinctions between visual training aid 210 and visual training aid 310 will be described in detail and the reader should reference the discussion above for features substantially similar between the two visual training aids.

With reference to FIGS. 3 and 4, visual training aid 310 includes an eyewear article 320 in the form of eyeglasses 321, a processor 330, memory 340, a global positioning system 350, a first image generator 360, a second image generator 362, and a clock 390. As shown in FIG. 3, visual training aid 310 generates an augmented reality display 370 to serve as a training aid for a user. As shown in FIG. 4, all components of visual training aid 310 is supported by eyewear 320.

Eyeglasses 321 supports components of visual training aid 310 and positions augmented reality display 370 in a position to be viewed by a user. In the example shown in FIG. 3, eyeglasses 321 include a first lens 322, a second lens 324, and a frame 338. In other examples, the eyewear article includes a single lens.

First and second lenses 322 and 324 are made of a substrate that is generally suitable for the display of an image on their surface for transmission of light through the lens. In some examples, one or both of the lenses are configured to transmit light primarily in a first direction towards the user's eye, with reduced or no transmission of light in the opposite direction. A wide range of conventional lenses may be used.

Frame 327 supports a first lens support 328 and a second lens support 329. Frame 327 may be made from any material conventionally used to construct eyeglass frames, including plastics and metals. The frame may adopt a wide variety of conventional eyewear frame designs. However, in the example depicted in FIG. 4, frame 327 is specially designed with a compartment 325 for housing components of visual training aid 310, including processor 330, memory 340, global positioning system 350, and clock 390. Additional components, such as batteries, may be housed in compartment 325 as well.

Visual training aid 310 can be operated in multiple modes. For example, modes of operation include a mode where both first image generator 360 and second image generator 362 are displaying augmented reality displays, a mode where just one of the first and second image generators are displaying an augmented reality display, and a mode where neither the first and second image generators are displaying an augmented reality display. The mode of operation depicted in FIG. 3 is a mode where only first image generator 360 is displaying an augmented reality display 370 on only first lens 322.

However, visual training aid 310 may be operated in a mode where second image generator 362 is displaying an augmented reality display onto second lens 324, either by itself or at the same time that first image generator 360 is displaying augmented reality display 370 onto first lens 322. In another mode, both first image generator and second image generator are deactivated. In some examples, one or both image generators are configured to display augmented reality displays on an external surface or medium distinct from the lenses.

As can be seen in FIG. 4, all of the components of visual training aid 310 are supported by eyeglasses 321. In particular, frame 327 supports processor 330, memory 340, global positioning system 350, and clock 390 in compartment 325. Frame 327 further supports first and second image generators 360 and 362 and first and second lenses 322 and 324. Thus, visual training aid 310 may be described as a self-contained or standalone embodiment.

Figure 5:
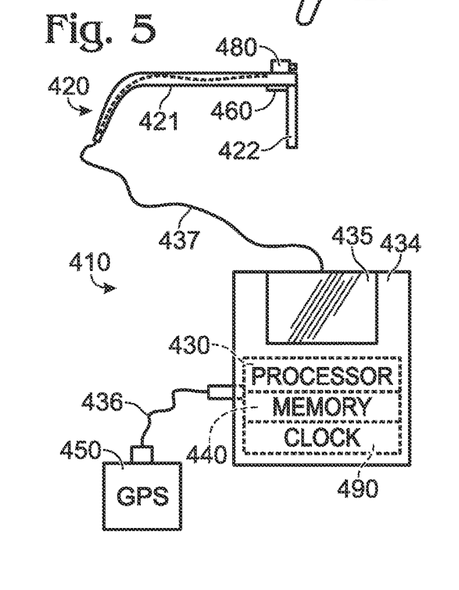
FIG. 5 illustrates an example of a visual training aid with a forward facing camera.

Turning attention to FIG. 5, a visual training aid 410 will now be described. Visual training aid 410 includes many similar or identical features to visual training aids 210 and 310 combined in unique and distinct ways. Thus, for the sake of brevity, each feature of visual training aid 410 will not be redundantly explained. Rather, key distinctions between visual training aids 210 and 310 and visual training aid 410 will be described in detail and the reader should reference the discussion above for features substantially similar between the different visual training aids.

With reference to FIG. 5, the reader can see that visual training aid 410 includes components separated from one another and connected by data wires or cables 436 and 437. Whereas visual training aid 310 was self-contained, visual training aid 410 includes a system of components working together to achieve visual training aid functions substantially similar to those described above. The reader can further see in FIG. 5 that visual training aid 410 includes a camera 480 and an external device 434 in addition to an eyewear article 420 in the form of eyeglasses 421 with a lens 422, a processor 430, memory 440, a global positioning system 450, a image generator 460, and a clock 490.

Data cables 436 and 437 may be any conventional data cable suitable for exchanging applicable data between devices. A variety of analog and digital data transfer technologies and interfaces may be employed, including interfaces such as the universal serial bus (USB) interface, the high-definition multimedia interface, (HDMI), the digital video interface (DVI), the IEEE 1394 interface, and the like. As can be seen in FIG. 5, data cable 436 connects global positioning system 450 with processor 430 housed in external device 434. Data cable 437 connects external device 434 with image generator 460 supported by eyeglasses 421.

External device 434 houses processor 430, memory 440, and clock 490. In some examples, the external device houses a global positioning system as well. As can be seen in FIG. 5, external device 434 includes a display screen 435, which is configured to display information to a user. In some examples, the display screen is a touch screen configured to read touch inputs by a user.

The external device may be a wide variety of commercially available electronic devices designed for functions beyond those applicable to a visual training aid. For example, the external device may be an Apple iPhone® brand mobile phone, mobile phones in general, an Apple iTouch® brand mobile device, a mobile device designed with the Android® operating system, portable media players, personal computers, personal data assistants, watches, and other mobile computing devices that are capable of executing third-party developed software. External device 434 is programmed with software instructions and drivers necessary for processor 430 to achieve the functions described herein of a visual training aid.

Camera 480 is mounted to eyeglasses 421 in a position to capture course image data. In the example shown in FIG. 5, camera 480 is configured to dynamically target a portion of the course and capture course image data corresponding to where a user wearing the eyeglasses is looking.

Processor 430 is configured to dynamically read the course image data from camera 480 and store it in memory 440, in addition to other functions, such as correlating the course image data with time interval data from clock 490 and position data from global positioning system 450. In examples where the visual training aid includes a display monitor, the course image data is displayed on the display monitor to assist the user to perceive the course.

Figure 6:
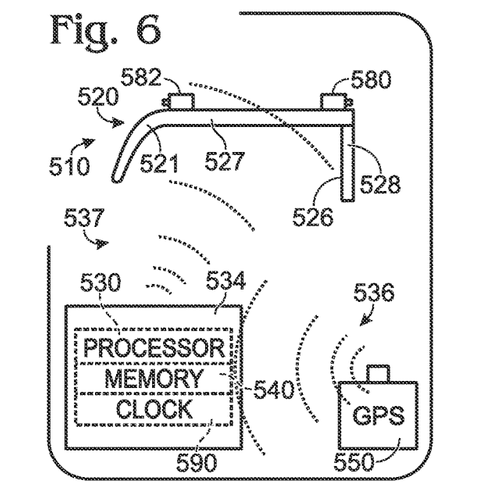
FIG. 6 illustrates an example of a visual training aid with a forward facing camera and a rearward facing camera and where components of the visual training aid are connected by a wireless data communications link.

Turning attention to FIG. 6, a visual training aid 510 will now be described. Visual training aid 510 includes many similar or identical features to visual training aids 210, 310, and 410 combined in unique and distinct ways. Thus, for the sake of brevity, each feature of visual training aid 510 will not be redundantly explained. Rather, key distinctions between visual training aids 210, 310, and 410 and visual training aid 510 will be described in detail and the reader should reference the discussion above for features substantially similar between the different visual training aids.

With reference to FIG. 6, the reader can see that visual training aid 510 includes components separated from one another and in data communication with one another with a first wireless communications link 536 and a second wireless communications link 537. Whereas visual training aid 310 was self-contained and the components of visual training aid 410 were in data communication with data cables 436 and 437, visual training aid 510 includes a system of components working together wirelessly to achieve visual training aid functions substantially similar to those described above. The reader can further see in FIG. 6 that visual training aid 510 includes a front camera 580 and a rear camera 582 in addition to an eyewear article 520 in the form of eyeglasses 521 with a frame 527 and a lens support 528, a display monitor 526, an external device 534, a processor 530, memory 540, a global positioning system 550, and a clock 590.

Wireless data communications links 536 and 537 may be any conventional wireless data communications link for exchanging applicable data between devices. For example, the wireless data communications links may employ communications standards such as WiFi™, Bluetooth™, WiMax, and the like. Any conventional or latter developed wireless data communications link technology may be used with visual training aid 510.

Front camera 580 targets a portion of the course disposed in front of display monitor 526. Rear camera 582 targets a portion of the course behind the user. Expressed another way, front camera 580 is positioned to capture forward course image data corresponding to images of the course forward of a user wearing eyeglasses 521 and rear camera 582 is positioned to capture rearward course image data corresponding to images of the course behind the user. Front camera 580 and rear camera 582 may be the same or different and may each be configured to capture still images or a sequence of still images to define a video.

Display monitor 526 is mounted to eyeglasses 521 in lens support 528. In the particular example shown in FIG. 6, display monitor 526 is at least partially transparent to enable a user wearing eyeglasses 521 to see the course through display monitor 526. However, course image data collected from one or more of front camera 580 and rear camera 582 and displayed on display monitor 526 via instructions from processor 530 further assists the user to perceive the course. In examples where the display monitor is not at least partially transparent, the course image data collected by the front and rear cameras and displayed on the display monitor via instructions from the processor may be the primary means for the user to perceive the course by at least one of his eyes.

The virtual training aids described herein may be configured to connect to the internet, although this functionality is not required. This disclosure contemplates the use of internet connectivity by internet capable visual training aids to store and retrieve training data between computers and devices connected via the internet. Further, two or more visual training aids may share training data between them, in real-time or over time spans, via the internet. Uploading training data to social networking sites and applications is also contemplated.

Visual training aids may additionally include an attached or integrated audio device. The audio devices may be configured to output audio signals to headphones, ear buds, or other portable means of playing audio. Audio devices may be useful in providing additional training data or for playing stored audio during a workout.

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A visual training aid, comprising:
    an eyewear article including a display monitor that at least partially blocks a user's view, the eyewear article configured to be worn by a user moving along a competitive training course;
    an image generator mounted to the eyewear article in a position to display an image on the display monitor that is viewable by the user;
    a processor in data communication with the image generator;
    a global positioning system in data communication with the processor;
    a computer readable medium in data communication with the processor; and
    a camera mounted to the eyewear article in a position to capture competitive training course image data,
    wherein the global positioning system generates current position data of the eyewear article,
    wherein the processor is programmed with instructions for selecting from the computer readable medium time-stamped past position data of the eyewear article on the competitive training course, for correlating the time-stamped past position data of the eyewear article with the current position data of the eyewear article, and for displaying on the display monitor a dynamically updated visual image of at least one person representing at least one virtual competitor based on the correlation between past position data and current position data while the eyewear article moves along the competitive training course, and wherein the camera is configured to capture and display on the display monitor a portion of the competitive training course as competitive training course image data corresponding to where the user is looking.

2. The visual training aid of claim 1, wherein the processor is programmed with instructions for dynamically:

determining the current position data of the eyewear article on the competitive training course at a given time interval relative to a current course start time based on dynamic current position data acquired from the global positioning system;

reading past position data of the eyewear article stored in the computer readable medium corresponding to the eyewear article's position on the competitive training course during a prior training session at the given time interval relative to a past course start time; and sending image data to the image generator for displaying the dynamically updated visual image of the at least one person representing the at least one virtual competitor on the display monitor depicting the eyewear article's position on the course during the prior training session relative to the current position of the eyewear article at the given time interval.

3. The visual training aid of claim 2, wherein the instructions for sending image data to the image generator for displaying the dynamically updated visual image of the person representing the at least one virtual competitor on the display monitor include instructions for displaying an animated depiction of the at least one virtual competitor on the course during a prior training session relative to the current position of the eyewear article at the given time interval.

4. The visual training aid of claim 2, wherein:

the instructions for reading past position data of the eyewear article include instructions for reading a plurality of past position data sets for the eyewear article, each set of past position data corresponding to the eyewear article's position on the competitive training course during prior training sessions at the given time interval relative to prior training sessions respective course start times; and the instructions for sending image data to the image generator include instructions for displaying a dynamically updated visual image of a plurality of people representing the plurality of virtual competitors on the display monitor depicting the position on the competitive training course of each virtual competitor in the set of past position data during prior training sessions relative to the current position of the eyewear article at the given time interval relative to the sets of past position data respective course start times.

5. The visual training aid of claim 2, wherein the processor, the global positioning system, and the computer readable medium are incorporated into a portable electronic device and the processor is in data communication with the image generator via a cable or a wireless communications link.

6. The visual training aid of claim 1, wherein the image generator and the processor are cooperatively configured to display a series of images in succession to define a video.

7. The visual training aid of claim 1, wherein the image generator is configured to generate hologram images.

8. A visual training aid, comprising:

an eyewear article including a display monitor that at least partially blocks a user's view, the eyewear article configured to be worn by a user moving along a competitive training course;

an image generator mounted to the eyewear article in a position to display an image on the display monitor that is viewable by the user;

a processor in data communication with the image generator;

a global positioning system in data communication with the processor;

a computer readable medium in data communication with the processor; and a camera mounted to the eyewear article in a position to capture competitive training course image data, wherein the global positioning system generates current position data of the eyewear article, and wherein the processor is programmed with instructions for selecting from the computer readable medium time-stamped past position data of at least one virtual competitor on the competitive training course, for correlating the selected data with the eyewear article current position data on the competitive training course, for displaying on the monitor a dynamically updated visual image of the at least one virtual competitor based on the correlation between past position data and current position data while the user moves along the course, and for dynamically adjusting a direction in which the visual image of the at least one virtual competitor is displayed to correspond to dynamically updated data of a direction the user is currently looking.

9. The visual training aid of claim 8, wherein the processor is programmed with instructions to:

dynamically determine a current position of the eyewear article on the competitive training course at a given time interval relative to a current course start time based on dynamic current position data acquired from the global positioning system;

dynamically read past position data stored in the computer readable medium corresponding to the position on the course during a prior training session at the given time interval relative to a past course start time;

dynamically read course image data from the camera;

dynamically generate a phantom image by depicting the virtual competitor's position during the prior training session at the given time interval relative to the eyewear article into the course image data; and dynamically send the phantom image to the display monitor.

10. The visual training aid of claim 8, wherein the camera is configured to capture and display on the display monitor a portion of the competitive training course as competitive training course image data corresponding to where the user is looking.

11. The visual training aid of claim 8, wherein the camera targets a portion of the competitive training course disposed in front of the display monitor.

12. The visual training aid of claim 8, wherein the camera comprises a front camera and a rear camera, the front camera being positioned to capture forward course image data corresponding to images of the competitive training course forward of the user and the rear camera being positioned to capture rearward course image data corresponding to images of the competitive training course behind the user.

13. The visual training aid of claim 8, wherein the display monitor is at least partially transparent to enable a user wearing the eyewear article to see the competitive training course through the display monitor.

14. The visual training aid of claim 8, wherein the processor is programmed with instructions for dynamically updating a size of the visual image of the at least one virtual competitor to account for distance and perspective of the at least one virtual competitor based on the correlation between past position data and current position data while the user moves along the course.

15. An augmented reality display system, comprising:
an eyewear article including a display monitor that at least partially blocks a user's view, the eyewear article configured to be worn by a user moving along a competitive training course with a surrounding terrain;
an image generator mounted to the eyewear article in a position to display an image on the display monitor that is viewable by the user;
a processor in data communication with the image generator;
a global positioning system in data communication with the processor; and
a computer readable medium in data communication with the processor,
wherein the global positioning system generates current position data of the eyewear article, and
wherein the processor is programmed with instructions for selecting from the computer readable medium time-stamped past position data of at least one virtual competitor on the competitive training course, for correlating the selected data with the eyewear article current position data on the training course, for displaying on the display monitor a dynamically updated visual image of the at least one virtual competitor based on the correlation between past position data and current position data while the user moves along the course, and for integrating the visual image of the at least one virtual competitor into the user's view of the competitive training course and the surrounding terrain.

16. The augmented reality display system of claim 15, further comprising a camera mounted to the eyewear article in a position to capture competitive training course image data.

17. The augmented reality display system of claim 16, wherein the camera is configured to capture and display on the display monitor a portion of the competitive training course as competitive training course image data corresponding to where the user is looking.

18. The augmented reality display system of claim 15, wherein the augmented reality display system is a visual training aid.

19. The augmented reality display system of claim 15, wherein the processor is further programmed with instructions for dynamically adjusting a direction in which the visual image of the at least one virtual competitor is displayed to correspond to dynamically updated data of a direction the user is currently looking.

20. The augmented reality display system of claim 15, furthering comprising a lens for the eyewear article, the image generator being mounted to the eyewear article in a position to display an image on the lens that is viewable by the user, and the processor is further programmed with instructions for integrating the visual image of the at least one virtual competitor with the user's view of the training course and the terrain through the lens.

* * * * *